(12) United States Patent
Namkung et al.

(10) Patent No.: US 10,964,723 B2
(45) Date of Patent: *Mar. 30, 2021

(54) FLEXIBLE DISPLAY PANEL

(71) Applicants: Samsung Display Co., Ltd., Yongin-si (KR); Korea Advanced Institute of Science and Technology, Daejeon (KR)

(72) Inventors: Jun Namkung, Asan-si (KR); Seung Min Jane Han, Daejeon (KR); Youbin Kim, Daejeon (KR)

(73) Assignees: Samsung Display Co., Ltd., Yongin-si (KR); Korea Advanced Institute of Science and Technology, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/527,964

(22) Filed: Jul. 31, 2019

(65) Prior Publication Data

US 2019/0355758 A1 Nov. 21, 2019

Related U.S. Application Data

(63) Continuation of application No. 15/681,110, filed on Aug. 18, 2017, now Pat. No. 10,403,645, which is a
(Continued)

(30) Foreign Application Priority Data

Sep. 3, 2014 (KR) .................. 10-2014-0117214

(51) Int. Cl.
*H01L 51/00* (2006.01)
*H01L 27/12* (2006.01)
*H01L 51/52* (2006.01)

(52) U.S. Cl.
CPC ...... *H01L 27/1218* (2013.01); *H01L 27/1225* (2013.01); *H01L 27/1248* (2013.01);
(Continued)

(58) Field of Classification Search
CPC .................................................. H01L 51/0096
See application file for complete search history.

(56) References Cited

U.S. PATENT DOCUMENTS 9,306,071 B2 * 4/2016 Lee .................. H01L 29/78603

FOREIGN PATENT DOCUMENTS

| JP | 2011-215380 A | 10/2011 |
| JP | 2013-231982 A | 11/2013 |

(Continued)

OTHER PUBLICATIONS

Korean Patent Abstracts for KR 10-2007-0103050 A, which corresponds to KR Publication No. 10-1212663 B1, published Oct. 22, 2007, 1 page.
(Continued)

*Primary Examiner* — Yu-Hsi D Sun
(74) *Attorney, Agent, or Firm* — Lewis Roca Rothgerber Christie LLP (57) ABSTRACT

A flexible display panel includes a bending area and a surrounding area adjacent to the bending area. The barrier layer includes first silicon nitride layers and first silicon oxide layers which are overlapped with the bending area. The first silicon nitride layers and the first silicon oxide layers are stacked alternately. Each of the first silicon nitride layers may have a thickness less than or equal to about 400 Å, and each of the first silicon oxide layers may have a thickness less than or equal to about 650 Å.

15 Claims, 11 Drawing Sheets

Related U.S. Application Data continuation of application No. 14/806,556, filed on Jul. 22, 2015, now Pat. No. 9,768,197.

(52) U.S. Cl.
CPC ...... *H01L 27/1255* (2013.01); *H01L 51/0097* (2013.01); *H01L 51/5256* (2013.01); *Y02E 10/549* (2013.01); *Y02P 70/50* (2015.11)

(56) References Cited

FOREIGN PATENT DOCUMENTS

| | | |
|---|---|---|
| KR | 10-0295240 B1 | 11/2001 |
| KR | 10-2011-0090310 A | 8/2011 |
| KR | 10-2012-0046427 A | 5/2012 |
| KR | 10-1212663 B1 | 12/2012 |
| KR | 10-2013-0039186 A | 4/2013 |
| KR | 10-2014-0097940 A | 8/2014 |

OTHER PUBLICATIONS

Gao, Huajian, et al., Materials become insensitive to flaws at nanoscale: Lessons from nature, Applied Physical Sciences, May 13, 2003, pp. 5597-5600, vol. 100, No. 10, www.pnas.org.

\* cited by examiner

FLEXIBLE DISPLAY PANEL

CROSS-REFERENCE TO RELATED APPLICATIONS

This application is a continuation of U.S. patent application Ser. No. 15/681,110, filed Aug. 18, 2017, which is a continuation of U.S. patent application Ser. No. 14/806,556, filed Jul. 22, 2015, now U.S. Pat. No. 9,768,197, issued Sep. 19, 2017, which claims priority to and the benefit of Korean Patent Application No. 10-2014-0117214, filed on Sep. 3, 2014, the entire contents of all of which are incorporated herein by reference.

BACKGROUND

The present disclosure herein relates to a flexible display panel.

Recently, bendable or foldable display panels (hereinafter referred to as flexible display panels) are being further developed. Such a flexible display panel includes a flexible display panel and various functional members.

Typically, the flexible display panel includes a base member, various functional layers located on the base member, and pixels located on the base member.

SUMMARY

The present disclosure provides a flexible display panel having reduced defects.

Embodiments of the inventive concept provide flexible display panels including a base member, a barrier layer, and a pixel. The barrier layer may be located on the base member, and may include first silicon nitride layers and first silicon oxide layers which are stacked alternately. The pixel may be located on the barrier layer, and may include a thin film transistor and a display element connected to the thin film transistor. The first silicon nitride layers each may have a thickness less than or equal to about 400 Å, and the first silicon oxide layers each may have a thickness less than or equal to about 650 Å.

In some embodiments, a total thickness of the first silicon oxide layers may range from about 500 Å to about 10,000 Å. Herein, a total thickness of the first silicon nitride layers may be less than that of the first silicon oxide layers.

In other embodiments, a flexible display panel according to an embodiment of the inventive concept includes a bending area and a surrounding area adjacent to the bending area. The barrier layer includes first silicon nitride layers and first silicon oxide layers which are overlapped with the bending area. The first silicon nitride layers and the first silicon oxide layers are stacked alternately. The barrier layer includes at least one second silicon nitride layer overlapped with the surrounding area and at least one second silicon oxide layer overlapped with the second silicon nitride layer.

In still other embodiments, each of the first silicon nitride layers may have a thickness less than or equal to about 400 Å, and each of the first silicon oxide layers may have a thickness less than or equal to about 650 Å. The second silicon nitride layer has a thickness greater than those of the first silicon nitride layers, and the second silicon oxide layer has a thickness greater than those of the first silicon oxide layers.

In even other embodiments, a flexible display panel according to an embodiment of the inventive concept may further include a boundary area defined between the bending area and the surrounding area. The first silicon nitride layers and the first silicon oxide layers may be spaced from the second silicon nitride layer and the second silicon oxide layer with the boundary layer disposed therebetween.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, a flexible display panel according to an embodiment of the inventive concept will be described with reference to the accompanying drawings.

In the drawings, scales of some elements are exaggerated or reduced to clearly illustrate a plurality of layers and areas. Like reference numerals or symbols refer to like elements throughout. And, it will also be understood that when a layer (or film) is referred to as being 'on' another layer or substrate, it may be directly on the other layer or substrate, or intervening layers may also be present. Furthermore, although one surface of a layer is illustrated to be flat, it is not necessarily required to be flat but a stepped portion may be exist on a surface of an upper layer due to a surface morphology of an underlying layer during a stacking process.

Figure 1:
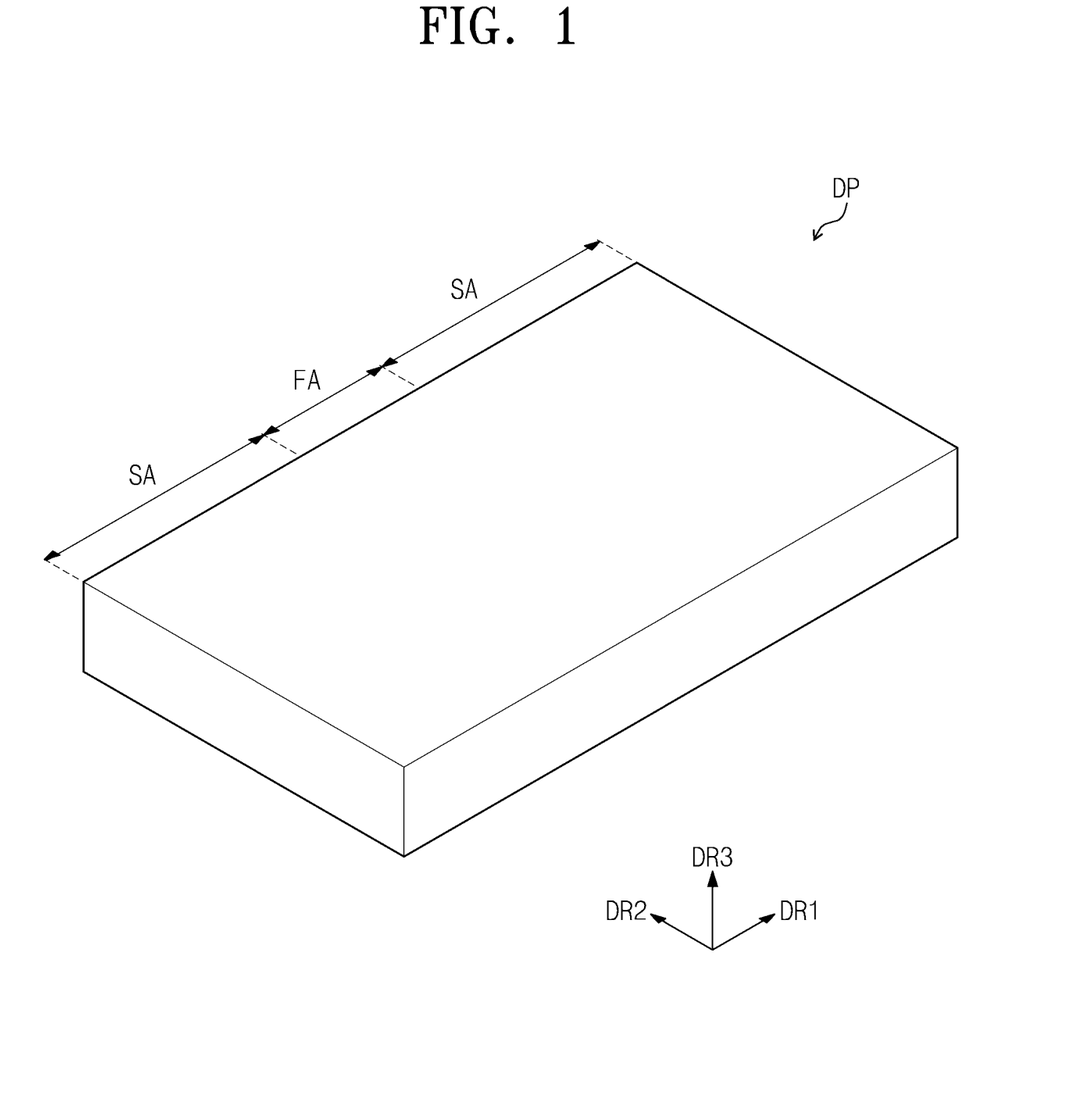
FIG. 1 is a perspective view illustrating a flexible display panel according to an embodiment of the inventive concept.
Figure 2:
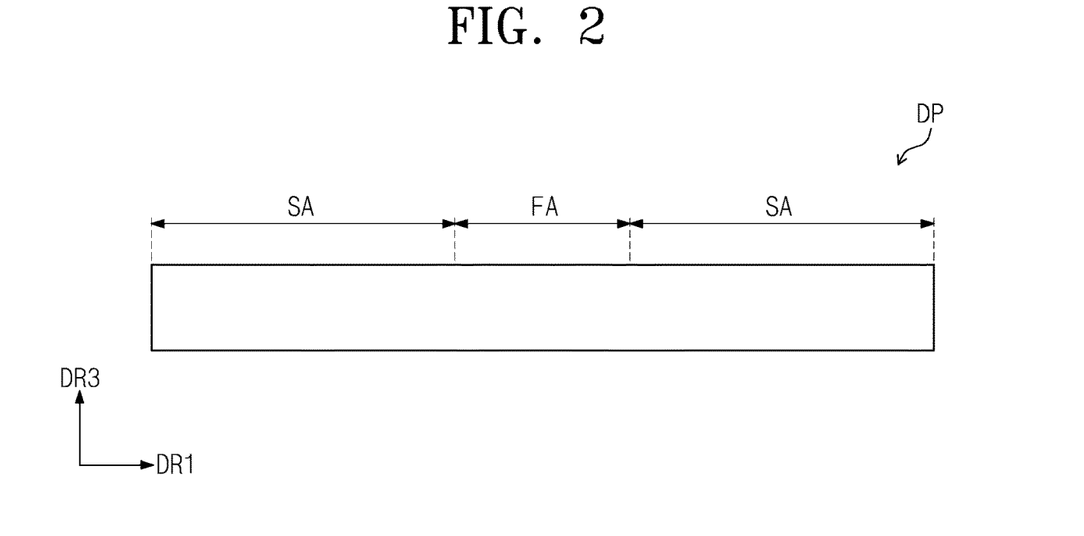
FIG. 2 is a side view illustrating an unfolded state of a flexible display panel according to an embodiment of the inventive concept.
Figure 3:
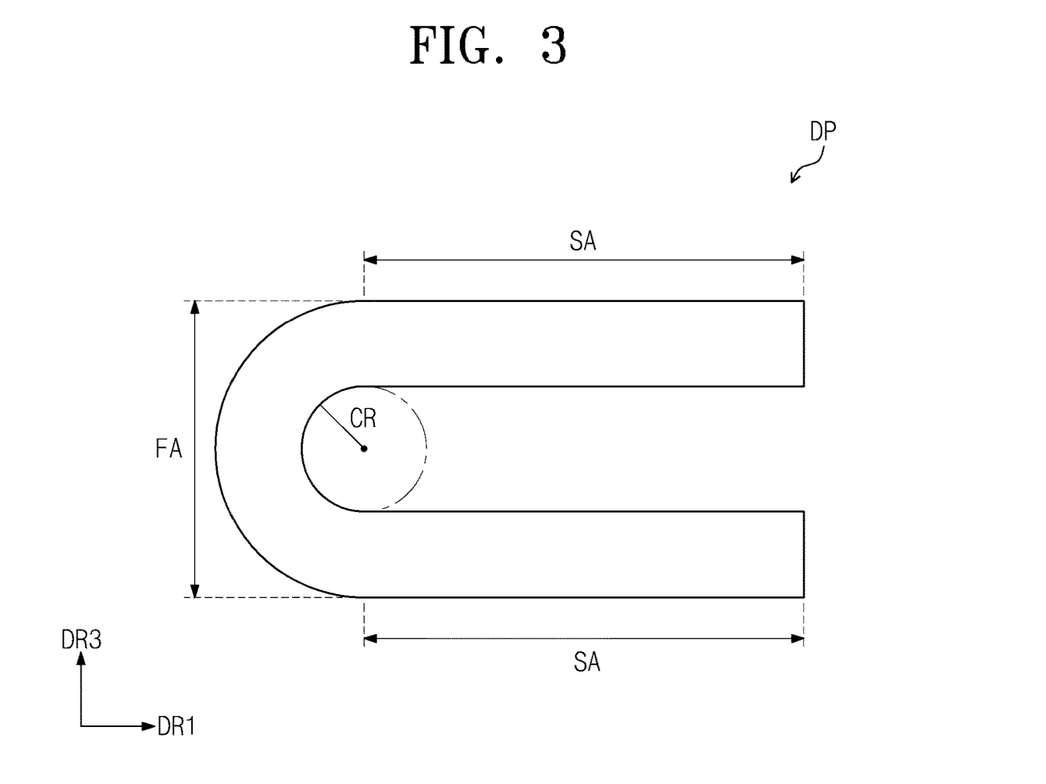
FIG. 3 is a side view illustrating a folded state of a flexible display panel according to an embodiment of the inventive concept.

FIG. 1 is a perspective view illustrating a flexible display panel according to an embodiment of the inventive concept. FIG. 2 is a side view illustrating an unfolded state of a flexible display panel according to an embodiment of the inventive concept. FIG. 3 is a side view illustrating a bent state of a flexible display panel according to an embodiment of the inventive concept.

As illustrated in FIGS. 1 to 3, a flexible display panel DP according to an embodiment of the inventive concept includes a bending area FA and surrounding areas SA. The bending area FA is defined as an area in which the flexible display panel DP is folded. The surrounding areas SA are defined as areas adjacent to the bending area FA. The surrounding areas SA may be flat or bent gradually.

Each of the bending area FA and the surrounding areas SA includes a plurality of pixels. The bending area FA and the surrounding areas SA create an image without distinction. The flexible display panel DP may display an image unidirectionally or bidirectionally.

FIG. 3 illustrates the flexible display panel DP bent according to a using form. The flexible display panel DP may be completely folded such that the two surrounding areas SA face each other. That is, the flexible display panel DP may be folded 180 degrees at the bending area FA. Herein, the flexible display panel DP may have a radius curvature CR ranging from about 0.5 mm to about 10 mm. According to another using form, the flexible display panel DP may be bent in a direction opposite to that in FIG. 3, and a bending angle is adjustable.

In this embodiment, the flexible display panel DP is exemplarily illustrated as including one bending area FA, but in an embodiment of the inventive concept, the flexible display panel DP may include two or more bending areas FA. Furthermore, in an embodiment of the inventive concept, the flexible display panel DP may be bent or rolled to have a curved surface on the whole. Furthermore, another area may be defined between the bending area FA and the surrounding areas SA, and each of the surrounding areas SA may be divided into a plurality of areas.

The flexible display panel DP according to the inventive concept may be an organic light emitting display panel, an electrophoresis display panel, or an electrowetting display panel, etc. Display panels include different display elements according to their types. Hereinafter, an organic light emitting display panel that includes an organic light emitting diode as a display element will be described exemplarily.

Figure 4:
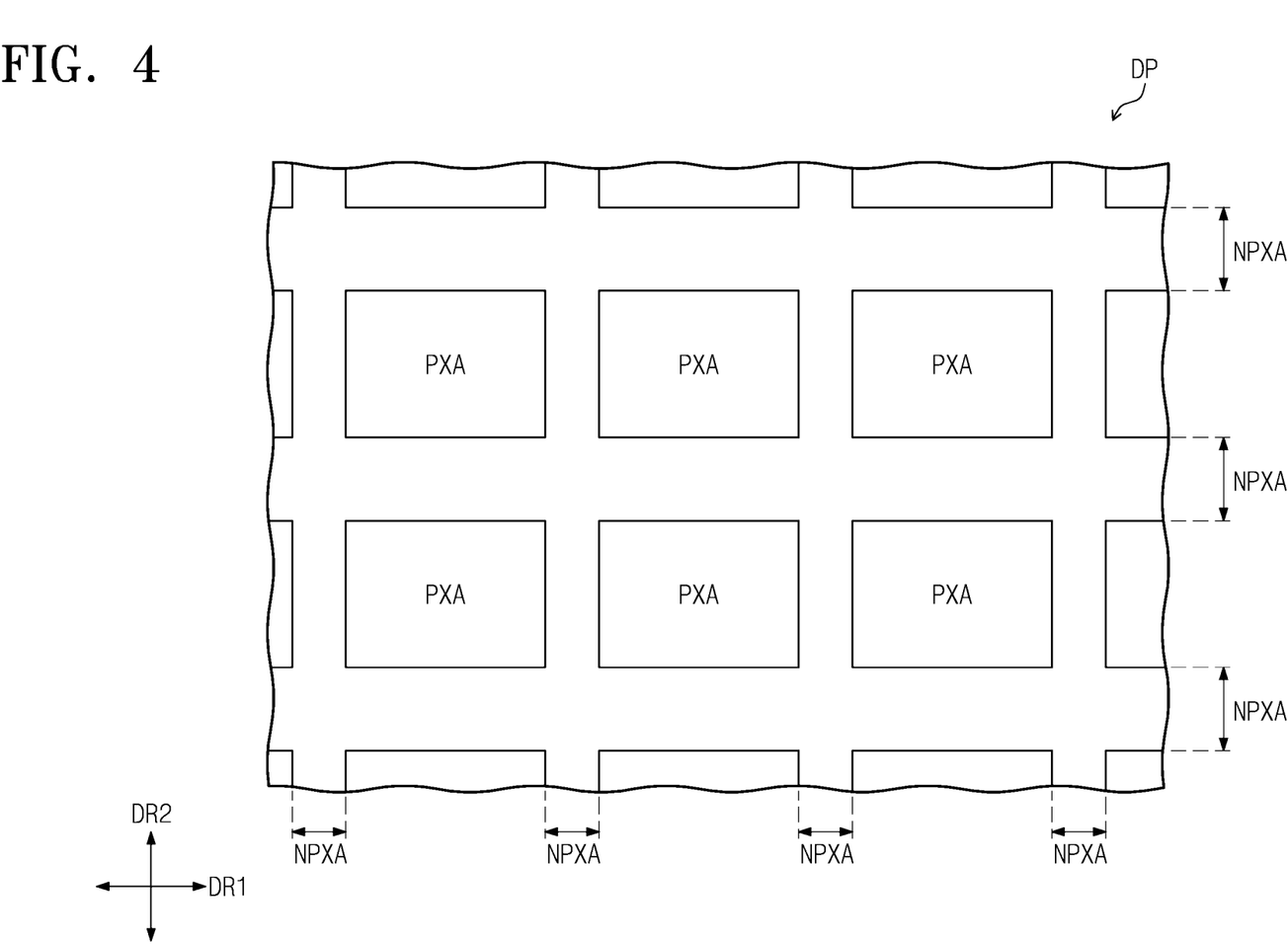
FIG. 4 is a plan view illustrating a portion of a flexible display panel according to an embodiment of the inventive concept.
Figure 5:
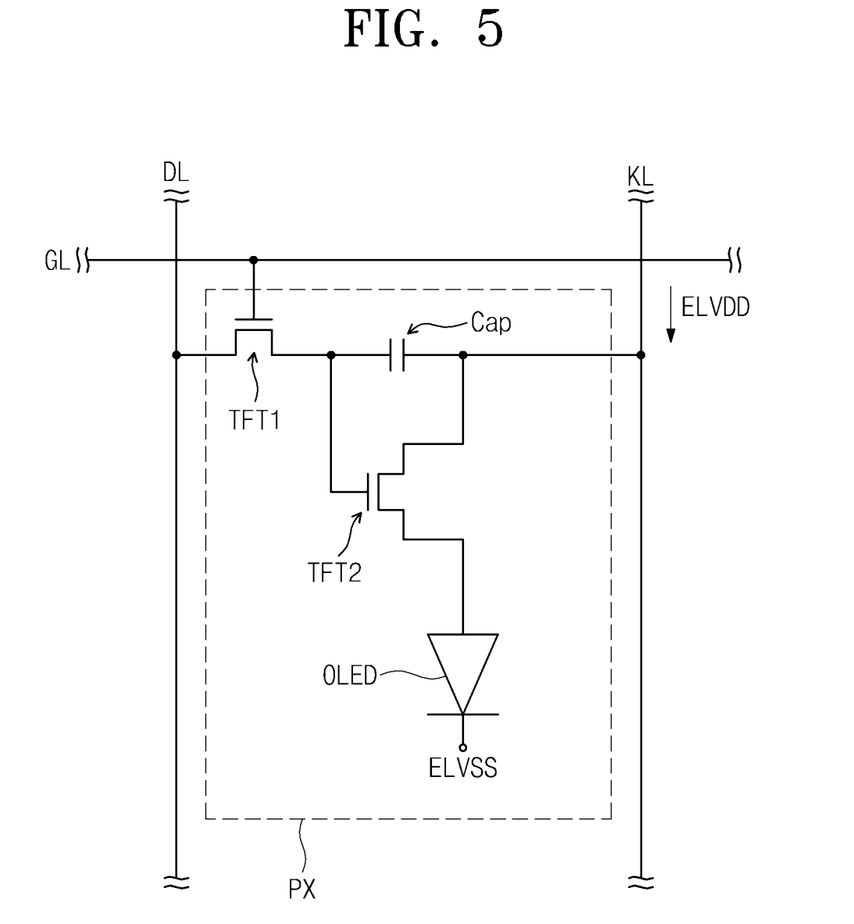
FIG. 5 is an equivalent circuit diagram of a pixel of a flexible display panel according to an embodiment of the inventive concept.

FIG. 4 is a plan view illustrating a portion of a flexible display panel according to an embodiment of the inventive concept. FIG. 5 is an equivalent circuit diagram of a pixel of a flexible display panel according to an embodiment of the inventive concept.

As illustrated in FIG. 4, the flexible display panel DP may be divided into a plurality of luminescent areas PXA and a non-luminescent area NPXA surrounding the plurality of luminescent areas PXA. Each of the bending area FA and the surrounding area SA which are illustrated in FIGS. 1 to 3 includes the plurality of luminescent areas PXA and the non-luminescent area NPXA.

The plurality of luminescent areas PXA each may be defined as an area in which an organic light emitting diode OLED of a pixel PX is overlapped, which will be described later. Also, the non-luminescent area NPXA is defined as an area in which a circuit or signal lines DL, GL, and KL of a pixel PX are overlapped.

As illustrated in FIG. 5, the pixel PX includes a first thin film transistor TFT1, a second thin film transistor TFT2, a capacitor Cap, and an organic light emitting diode OLED. Alternatively, an equivalent circuit of the pixel PX is not limited to that in FIG. 5, but may be modified.

The first thin film transistor TFT1 includes a control electrode connected to a gate line GL, an input electrode connected to a data line DL, and an output electrode. The first thin film transistor TFT1 outputs a data signal applied to the data line DL in response to a gate signal applied to the gate line GL.

The capacitor Cap includes a first electrode connected to the first thin film transistor TFT1 and a second electrode which receives a first power supply voltage ELVDD. The capacitor Cap charges voltage corresponding to the data signal received from the first thin film transistor TFT1.

The second thin film transistor TFT2 includes a control electrode connected to the output electrode of the first thin film transistor TFT1 and the first electrode of the capacitor Cap, an input electrode which receives the first power supply voltage ELVDD, and an output electrode. The output electrode of the second thin film transistor TFT2 is connected to the organic light emitting diode OLED. The second thin film transistor TFT2 controls a driving current which flows through the organic light emitting diode OLED to correspond to voltage charged in the capacitor Cap.

The organic light emitting diode OLED includes a first electrode connected to the second thin film transistor TFT2, and a second electrode which receives a second power supply voltage ELVSS. Furthermore, the organic light emitting diode OLED includes an organic light emitting layer disposed between the first electrode and the second electrode. The organic light emitting diode OLED emits light during turn-on intervals of the second thin film transistor TFT2.

Figure 6:
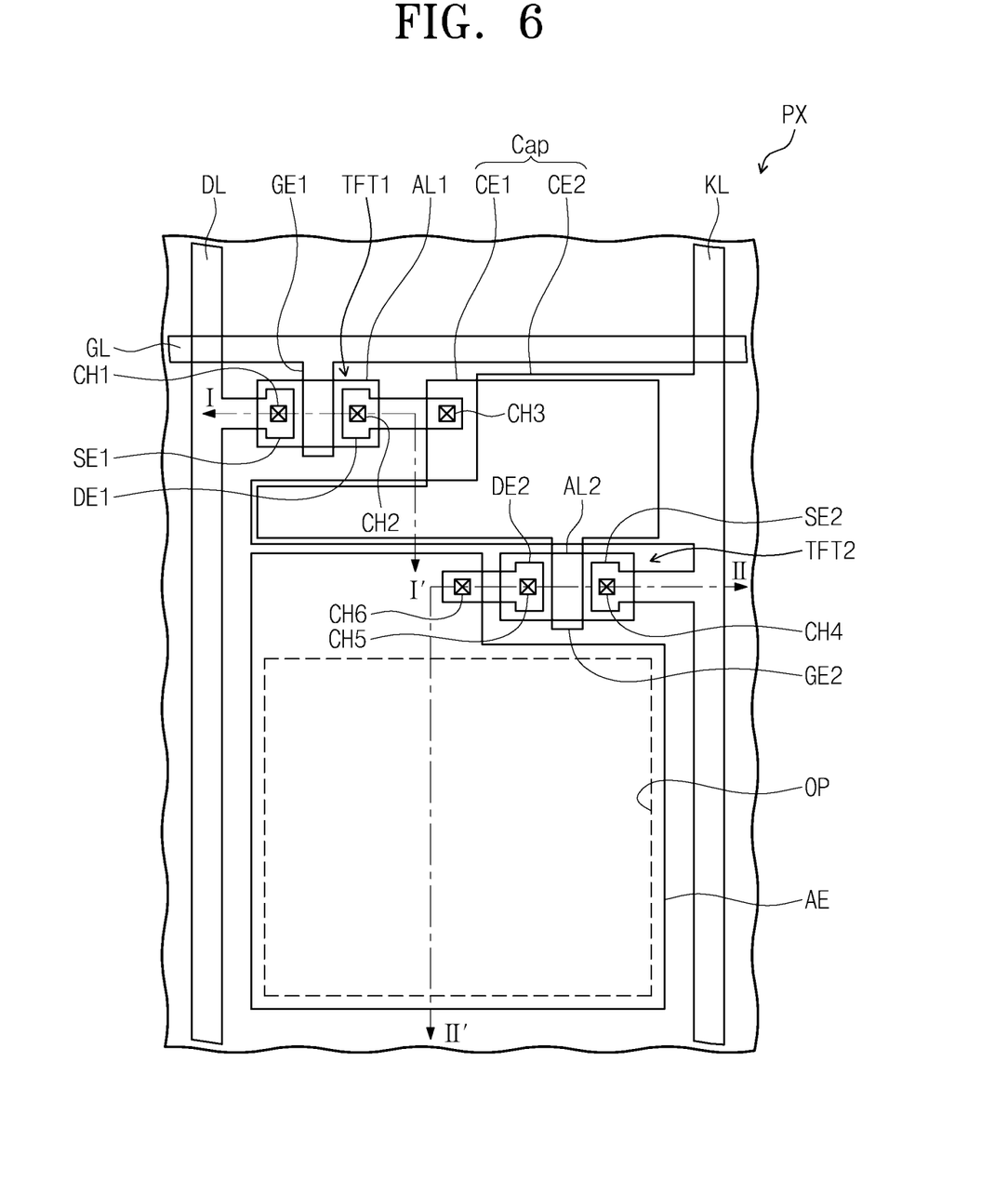
FIG. 6 is a layout of a pixel according to an embodiment of the inventive concept.
Figure 7:
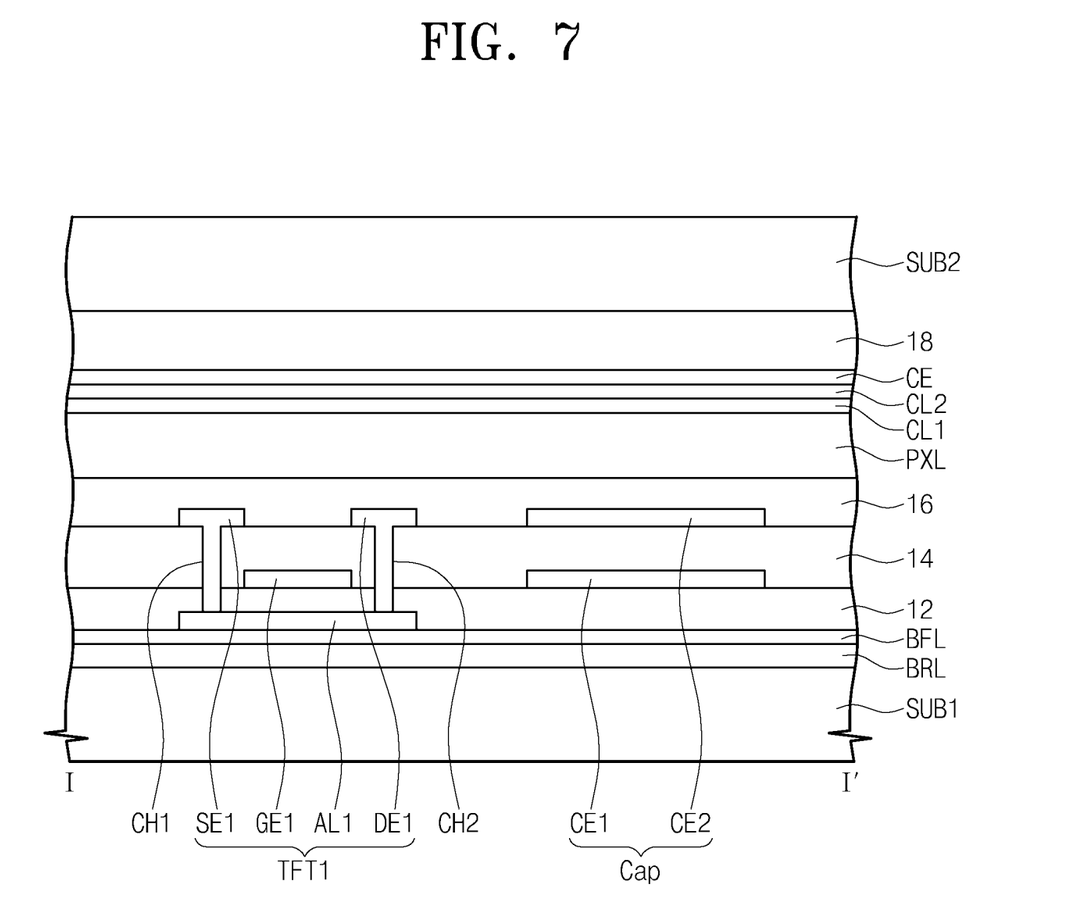
FIG. 7 is a sectional view taken along line I-I' in FIG. 6.
Figure 8:
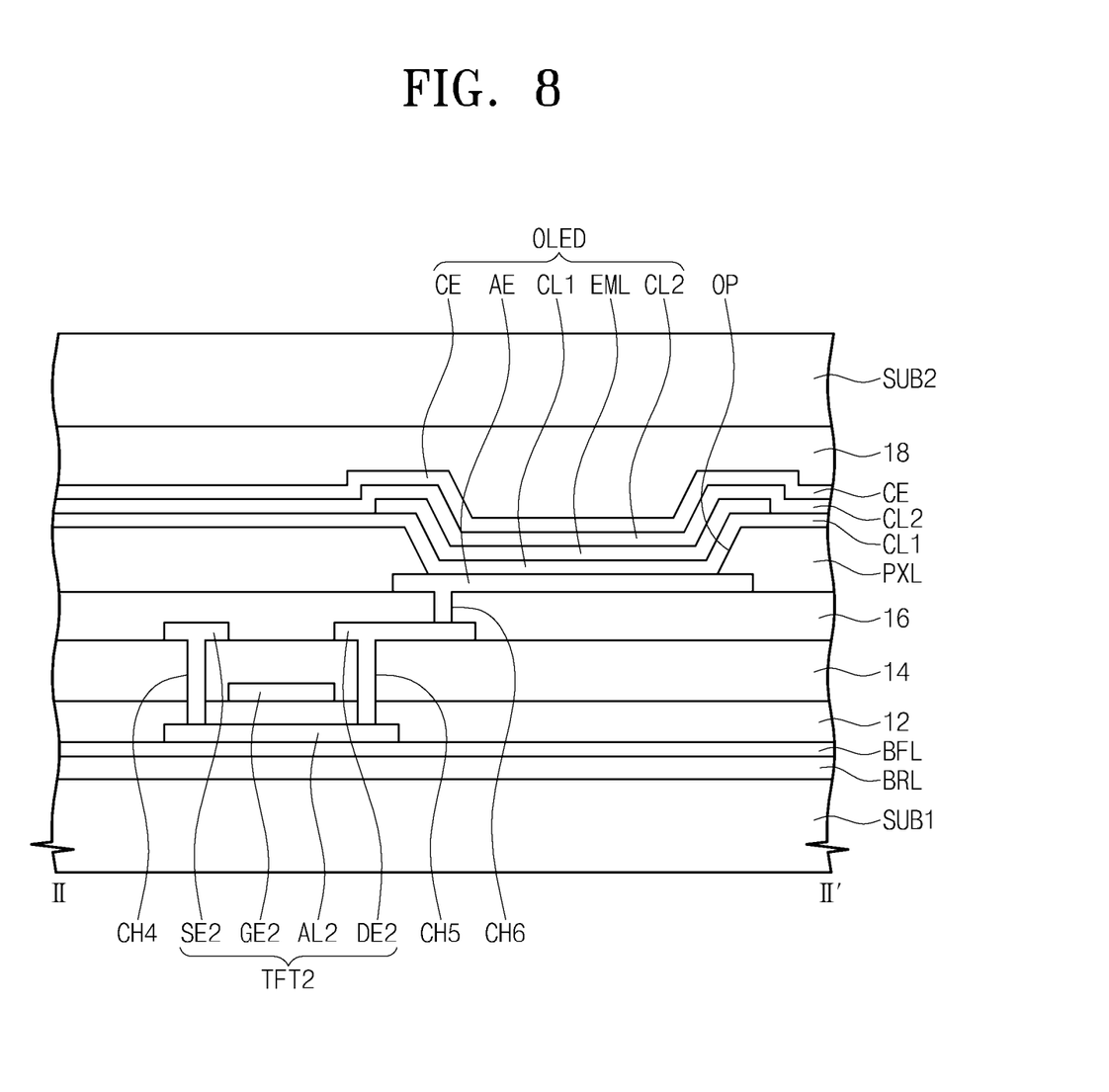
FIG. 8 is a sectional view taken along line II-II' in FIG. 6.

FIG. 6 is a layout of a pixel according to an embodiment of the inventive concept. FIG. 7 is a sectional view taken along line I-I' in FIG. 6. FIG. 8 is a sectional view taken along line II-II' in FIG. 6. FIG. 6 illustrates a layout of a pixel corresponding to the equivalent circuit in FIG. 5. Hereinafter, a flexible display panel will be described in more detail with reference to FIGS. 5 to 7.

The flexible display panel DP includes a base member SUB1, functional layers BRL and BFL, signal lines GL and DL, a pixel PX, and an encapsulation member SUB2. The constitutions of the base member SUB1, the functional layers BRL and BFL, the signal lines GL and DL, the pixels PX, and the encapsulation member SUB2 may vary with to the type of the flexible display panel DP The base member SUB1 may include a flexible plastic substrate made of, for example, polyamide. The functional layers BRL and BFL are located on one surface of the base member SUB1. The functional layers BRL and BFL include a barrier layer BRL and a buffer layer BFL. The buffer layer BFL is located on the barrier layer BRL.

The barrier layer BRL prevents or minimizes impurities that exist in the base member SUB1 from being introduced into the pixel PX during manufacturing process. Particularly, the barrier layer BRL prevents the impurities from diffusing into semiconductor patterns AL1 and AL2 of the pixel PX. The impurities may be introduced from the outside, or may be come out by thermal decomposition of the base member SUB1. The impurities may be, for example, sodium or gas emitted from the base member SUB1. Furthermore, the barrier layer BRL blocks moisture from being introduced into the pixel PX from the outside.

The buffer layer BFL supplements functions of the barrier layer BRL. At the same time, the buffer layer BFL enhances properties of the thin film transistors TFT1 and TFT2 as compared with the barrier layer BRL. Further detailed description therefore will be provided later. In an embodiment of the inventive concept, the buffer layer BFL may be omitted.

The signal lines GL and DL and the pixel PX are located on the buffer layer BFL. A semiconductor pattern AL1 (hereinafter, a first semiconductor pattern) of the first thin film transistor TFT1 and a semiconductor pattern AL2 (hereinafter, a second semiconductor pattern) of the second thin film transistor TFT2 are located on the buffer layer BFL. The first semiconductor pattern AL1 and the second semiconductor pattern AL2 may include amorphous silicon formed at low temperature. In addition, the first semiconductor pattern AL1 and the second semiconductor pattern AL2 may include a metal oxide semiconductor.

A first insulation layer 12, which covers the first semiconductor pattern AL1 and the second semiconductor pattern AL2, is located on the buffer layer BFL. The first insulation layer 12 includes an organic layer and/or an inorganic layer. In one embodiment, the first insulation layer 12 may include a plurality of inorganic thin films. The plurality of inorganic thin films may include a silicon nitride layer and a silicon oxide layer.

The gate line GL is located on the first insulation layer 12. A control electrode GE1 (hereinafter, a first control electrode) of the first thin film transistor TFT1 and a control electrode GE2 (hereinafter, a second control electrode) of the second thin film transistor TFT2 are located on the first insulation layer 12.

A first electrode CE1 in the capacitor Cap is located on the first insulation layer 12. The first electrode CE1 may be formed along with the gate line GL through the same photolithography process. In other words, the first electrode CE1 and the gate line GL may be made of the same material.

A second insulation layer 14, which covers the first control electrode GE1, the second control electrode GE2, and the first electrode CE1, is located on the first insulation layer 12. The second insulation layer 14 includes an organic layer and/or an inorganic layer. Particularly, the second insulation layer 14 may include a plurality of inorganic thin films. The plurality of inorganic thin films may include a silicon nitride layer and a silicon oxide layer.

The data line DL and a power supply line KL are located on the second insulation layer 14. An input electrode SE1 (hereinafter, a first input electrode) and an output electrode DE1 (hereinafter, a first output electrode) of the first thin film transistor TFT1 are located on the second insulation layer 14. An input electrode SE2 (hereinafter, a second input electrode) and an output electrode DE2 (hereinafter, a second output electrode) of the second thin film transistor TFT2 are located on the second insulation layer 14. The first input electrode SE1 is branched from the data line DL. The second input electrode SE2 is branched from the power supply line KL.

A second electrode CE2 of the capacitor Cap is located on the second insulation layer 14. The second electrode CE2 may be formed along with the data line DL through the same photolithography process and the power supply line KL, and made of the same material as those of the data line DL and the source line KL.

The first input electrode SE1 and the first output electrode DE1 are connected to the first semiconductor pattern AL1 via a first through-hole CH1 and a second through-hole CH2, respectively. Herein, the first through-hole CH1 and the second through-hole CH2 pass through the first insulation layer 12 and the second insulation layer 14. The first output electrode DE1 is connected to the first electrode CE1 via a third through-hole CH3 which passes through the second insulation layer 14. The second input electrode SE2 and the second output electrode DE2 are connected to the second semiconductor pattern AL2 via a fourth through-hole CH4 and a fifth through-hole CH5, respectively. Herein, the fourth through-hole CH4 and the fifth through-hole CH5 pass through the first insulation layer 12 and the second insulation layer 14. Alternatively, in another embodiment of the inventive concept, the first thin film transistor TFT1 and the second thin film transistor TFT2 may be modified to have a bottom-gate structure.

A third insulation layer 16, which covers the first input electrode SE1, the first output electrode DE1, the second input electrode SE2, and the second output electrode DE2, is located on the second insulation layer 14. The third insulation layer 16 includes an organic layer and/or an inorganic layer. Particularly, the third insulation layer 16 may include an organic substance to provide a flat surface.

A pixel defined layer PXL and the organic light emitting diode OLED are located on the third insulation layer 16. The organic light emitting diode OLED includes an anode AE, a first common layer CL1, an organic light emitting layer EML, a second common layer CL2, and a cathode CE which are stacked in sequence. The anode AE is connected to the second output electrode DE2 via a sixth through-hole CH6 which passes through the third insulation layer 16. Positions of the anode AE and the cathode CE in the organic light emitting diode OLED may be changed reversely.

The anode AE is located on the third insulation layer 16. An opening OP of the pixel defined layer PXL exposes the anode AE. The first common layer CL1 is located on the anode AE. The first common layer CL1 is disposed not only in a luminescent area PXA corresponding to the opening OP, but also in a plurality of other luminescent areas PXA (see FIG. 4) and a non-luminescent area NPXA. In other words, the first common layer CL1 is disposed throughout the base member SUB1. The first common layer CL1 includes a hole injection layer. The first common layer CL1 may further include a hole transport layer.

The organic light emitting layer EML is located on the first common layer CL1. The organic light emitting layer EML may be located only in an area corresponding to the opening OP. A second common layer CL2 is located on the organic light emitting layer EML. The second common layer CL2 is disposed throughout the base member SUB1 like the first common layer CL1. The second common layer CL2 includes an electron injection layer. The second common layer CL2 may further include an electron transport layer. The cathode CE is located on the second common layer CL2. The cathode CE is disposed throughout the base member SUB1.

An encapsulation layer 18 is located on the cathode CE. The encapsulation layer 18 may include a plurality of thin film encapsulation layers. The thin film encapsulation layers may include a silicon nitride layer and a silicon oxide layer.

The display panel DP may include another substrate SUB2 which faces the base member SUB1. The other substrate SUB2 may be an encapsulation substrate which protects the plurality of pixels PX.

In one embodiment, a protective film may be located on the other surface that faces the one surface of the base member SUB1 on which the functional layers BRL and BFL are disposed. The protective film may protect the pixel PX from the external impact.

Figure 9:
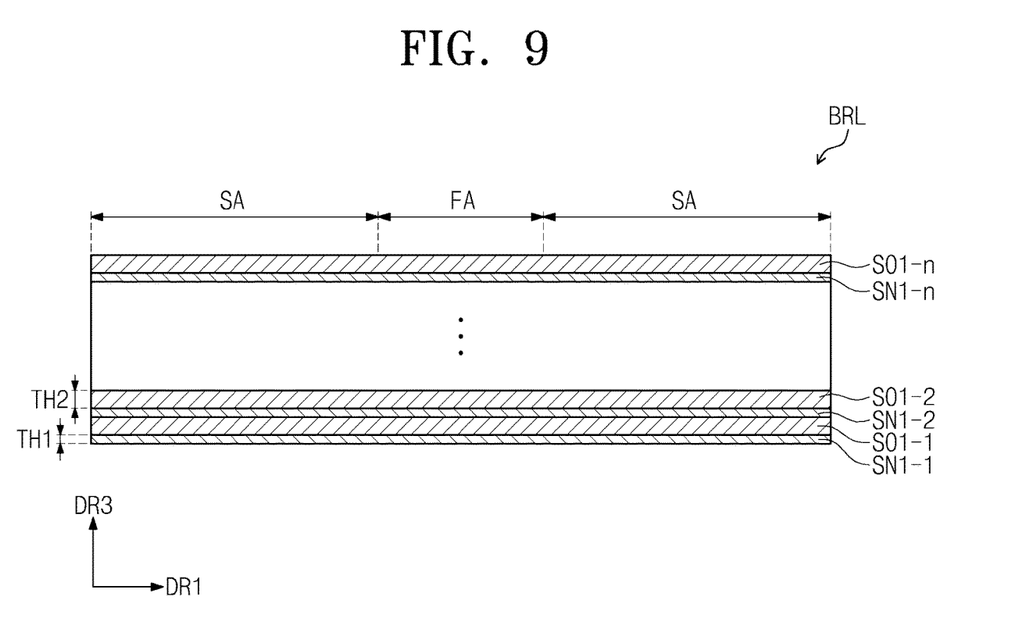
FIG. 9 is an expanded view of a barrier layer in FIG. 6.

FIG. 9 is an expanded view of the barrier layer in FIG. 6. Hereinafter, the barrier layer will be described in detail with reference to FIG. 9.

The barrier layer BRL includes silicon nitride layers SN1-1 to SN1-$n$ (hereinafter, first silicon nitride layers) and silicon oxide layers SO1-1 to SO1-$n$ (hereinafter, first silicon oxide layers) which are stacked alternately. The barrier layer BRL may be provided by means of chemical vapor deposition, thermal deposition, sputtering, or the like.

Bending stiffness of a single layer is expressed as Equation 1.

$$BS \propto E \times TH^3 \tag{1}$$

where BS is a bending stiffness, E is an elastic modulus, and TH is a thickness of a single layer.

The bending stiffness of a barrier layer having the single layer structure is proportional to the cube of thickness. On the other hand, the bending stiffness of a barrier layer BRL that includes the first silicon nitride layers SN1-1 to SN1-$n$ and the first silicon oxide layers SO1-1 to SO1-$n$ is equal to the sum of respective bending stiffnesses of the first silicon nitride layers SN1-1 to SN1-$n$ and the first silicon oxide layers SO1-1 to SO1-$n$. Therefore, the barrier layer BRL according to this embodiment may have a lower bending stiffness than a barrier layer having a single layer structure.

In general, a single layer is deformed by applied stress. Accordingly, if bending stress (tensile stress or compressive stress) is greater than yield strength, then the single layer is immediately fractured. If the single layer has a thickness less than a certain thickness, then it has plasticity in a predetermined range even though bending stress greater than yield strength is applied thereto. The thickness allowing the single layer to have the plasticity depends on a substance which constitutes the single layer. The thickness of the single layer having the plasticity may be calculated by Equation 2.

$$h^* \approx \alpha^2 \frac{\gamma \times E}{\sigma_{th}^2} \quad (2)$$

where h* is a thickness of a single layer, α is a parameter depending on the crack geometry, γ is a surface energy, E is a Young's modulus, σ is a theoretical strength. σ is equal to E/30.

Silicon nitride and silicon oxide have physical properties as shown in the following Table 1. The maximum thickness of the silicon nitride layer having the plasticity is 400 Å as calculated according to Equation 2. Likewise, the maximum thickness of the silicon oxide layer having the plasticity is 650 Å as calculated according to Equation 2.

TABLE 1

| | α, parameter depending on the crack geometry | γ, surface energy | E, Young's modulus | σ, theoretical strength |
|---|---|---|---|---|
| Silicon nitride | $\sqrt{\pi}$ | 1 J/m² | 76.5 GPa | 2.55 GPa |
| Silicon oxide | $\sqrt{\pi}$ | 1.6 J/m² | 82 GPa | 2.7 GPa |

In one embodiment, in order for the barrier layer BRL according to this embodiment to have plasticity in a predetermined range even though bending stress greater than yield strength is applied thereto, each of the first silicon nitride layers SN1-1 to SN1-$n$ has a thickness TH1 less than or equal to about 400 Å. For the same reason, in one embodiment each of the first silicon oxide layers SO1-1 to SO1-$n$ has a thickness TH2 less than or equal to about 650 Å.

The first silicon nitride layers SN1-1 to SN1-$n$ and the first silicon oxide layers SO1-1 to SO1-$n$ which have above-described thicknesses TH1 and TH2 have plasticity even though bending stress greater than yield strength occurs. Therefore, even though bending stress greater than yield strength is applied to the barrier layer BRL, fracture of the barrier layer BRL may be prevented.

The sum of thicknesses TH2 of the first silicon oxide layers SO1-1 to SO1-$n$ included in the barrier layer BRL may have a range of about 500 Å to about 10,000 Å. The sum of thicknesses TH1 of the first silicon nitride layers SN1-1 to SN1-$n$ included in the barrier layer BRL is less than the sum of thicknesses TH2 of the first silicon oxide layers SO1-1 to SO1-$n$. In consideration of impurities/moisture blocking function of the barrier layer BRL, the thicknesses TH1 of the first silicon nitride layers SN1-1 to SN1-$n$ and the thicknesses TH2 of the silicon oxide layers SO1-1 to SO1-$n$ may be varied within the above range. Furthermore, in consideration of a deposition time and manufacturing costs for the barrier layer BRL, the thicknesses TH1 of the first silicon nitride layers SN1-1 to SN1-$n$ and the thicknesses TH2 of the first silicon oxide layers SO1-1 to SO1-$n$ may be varied within the above range.

Herein, the first silicon nitride layers SN1-1 to SN1-$n$ may have the same thickness. Likewise, the first silicon oxide layers SO1-1 to SO1-$n$ may have the same thickness. The number of stacks of the first silicon nitride layers SN1-1 to SN1-$n$ and the first silicon oxide layers SO1-1 to SO1-$n$ may be changed variously in consideration of the thickness of the barrier layer BRL, the thicknesses of the first silicon nitride layers SN1-1 to SN1-$n$, and the thicknesses of the first silicon oxide layers SO1-1 to SO1-$n$.

For example, the flexible display panel DP may include a barrier layer BRL with a thickness of 3,500 Å which includes ten first silicon nitride layers SN1-1 to SN1-10, each having a thickness of 50 Å, and ten first silicon oxide layers SO1-1 to SO1-10, each having a thickness of 300 Å. Alternatively, the flexible display panel DP may include a barrier layer with a thickness of 2,550 Å which includes three first silicon nitride layers SN1-1 to SN1-3, each having a thickness of 200 Å, and three first silicon oxide layers SO1-1 to SO1-3, each having a thickness of 650 Å. Alternatively, the flexible display panel DP may include a barrier layer with a thickness of 5,600 Å which includes ten first silicon nitride layers SN1-1 to SN1-10, each having a thickness of 60 Å, and ten first silicon oxide layers SO1-1 to SO1-10, each having a thickness of 500 Å.

Alternatively, the flexible display panel DP may include a barrier layer with a thickness of 3,750 Å which includes three first silicon nitride layers SN1-1 to SN1-3, each having a thickness of 100 Å, three first silicon nitride layers SN1-4 to SN1-6, each having a thickness of 200 Å, three first silicon oxide layers SO1-1 to SO1-3, each having a thickness of 300 Å, and three first silicon oxide layers SO1-4 to SO1-6, each having a thickness of 650 Å.

According to the above-described barrier layers, a total thickness of the first silicon oxide layers SO1-1 to SO1-$n$ is greater than that of the first silicon nitride layers SN1-1 to SN1-$n$. Silicon oxide has a greater moisture blocking efficiency than silicon nitride. The barrier layers include more amount of silicon oxide than silicon nitride to enhance the moisture block efficiency.

Figure 10:
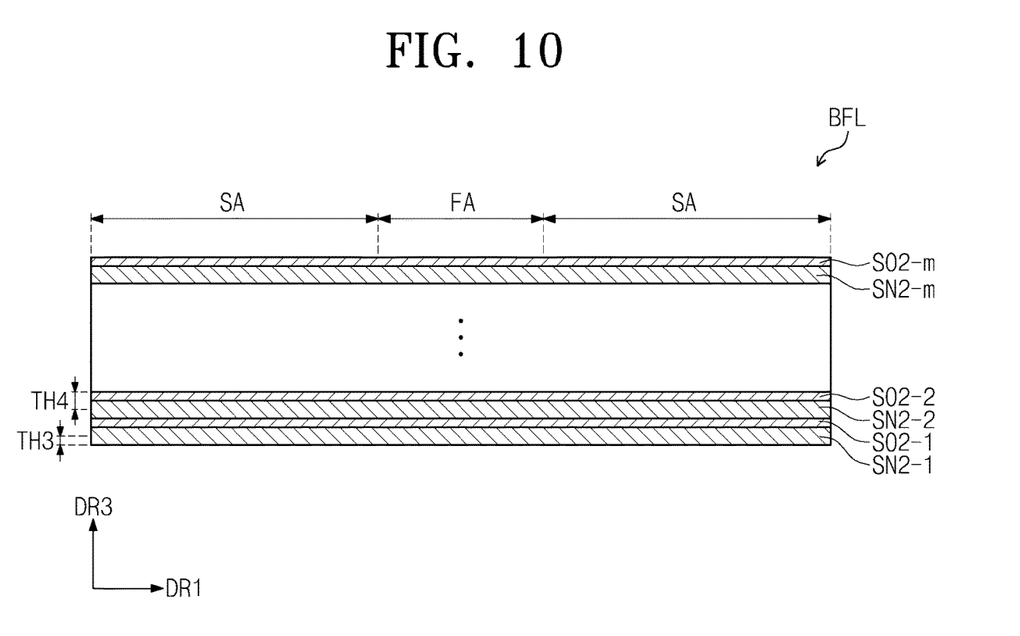
FIG. 10 is an expanded view of a buffer layer in FIG. 6.

FIG. 10 is an expanded view of the buffer layer in FIG. 6. Hereinafter, the buffer layer will be described in detail with reference to FIG. 10.

The buffer layer BFL includes silicon nitride layers SN2-1 to SN2-$m$ (hereinafter, second silicon nitride layers) and silicon oxide layers SO2-1 to SO2-$m$ (hereinafter, second silicon oxide layers) which are stacked alternately. The buffer layer BFL may be provided by means of chemical vapor deposition, thermal deposition, sputtering, or the like.

As described with reference to above Equation 1, the buffer layer BFL having a multi-layer structure may have a lower bending stiffness than a buffer layer having a single layer structure although they have the same thickness. As described with reference to above Equation 2, for the same reason as the first silicon nitride layers SN1-1 to SN1-$n$ and the first silicon oxide layers SO1-1 to SO1-$n$, each of the second silicon nitride layers SN2-1 to SN2-$m$ has a thickness TH3 less than or equal to about 400 Å, and each of the second silicon oxide layers SO2-1 to SO2-$m$ has a thickness TH4 less than or equal to about 650 Å.

The sum of thicknesses TH3 of the second silicon nitride layers SN2-1 to SN2-$m$ included in the buffer layer BFL may have a range of about 500 Å to about 10,000 Å. The sum of thicknesses TH4 of the second silicon oxide layers SO2-1 to SO2-$m$ included in the buffer layer BFL may be less than the sum of thicknesses TH3 of the second silicon nitride layers SN2-1 to SN2-$m$.

In one embodiment, the second silicon nitride layers SN2-1 to SN2-$m$ may have the same thickness. Likewise, the second silicon oxide layers SO2-1 to SO2-$m$ may have the same thickness. The number of stacks of the second silicon nitride layers SN2-1 to SN2-$m$ and the second silicon oxide layers SO2-1 to SO2-$m$ may be changed variously considering the thickness of the buffer layer BFL, the thicknesses of the second silicon nitride layers SN2-1 to SN2-$m$, and the thicknesses of the second silicon oxide layers SO2-1 to SO2-$m$.

For example, the flexible display panel DP may include a buffer layer BFL with a thickness of 2,500 Å which includes ten second silicon nitride layers SN2-1 to SN2-10, each having a thickness of 200 Å, and ten second silicon oxide layers SO2-1 to SO2-10, each having a thickness of 50 Å. Alternatively, the flexible display panel DP may include a buffer layer BFL with a thickness of 3,600 Å which includes five second silicon nitride layers SN2-1 to SN2-5, each having a thickness of 500 Å, five second silicon nitride layers SN2-6 to SN2-10, each having a thickness of 100 Å, five second silicon oxide layers SO1-1 to SO1-5, each having a thickness of 100 Å, and five second silicon oxide layers SO2-6 to SO2-10, each having a thickness of 20 Å.

According to the above-described buffer layer, a total thickness of the second silicon nitride layers SN2-1 to SN2-$m$ is greater than that of the second silicon oxide layers SO2-1 to SO2-$m$. A thin film transistor provided on a buffer layer that includes more amount of silicon nitride than silicon oxide has a higher mobility, a lower leakage current, and a lower subthreshold swing than a thin film transistor provided on a buffer layer that includes less amount of silicon nitride than silicon oxide.

Figure 11A:
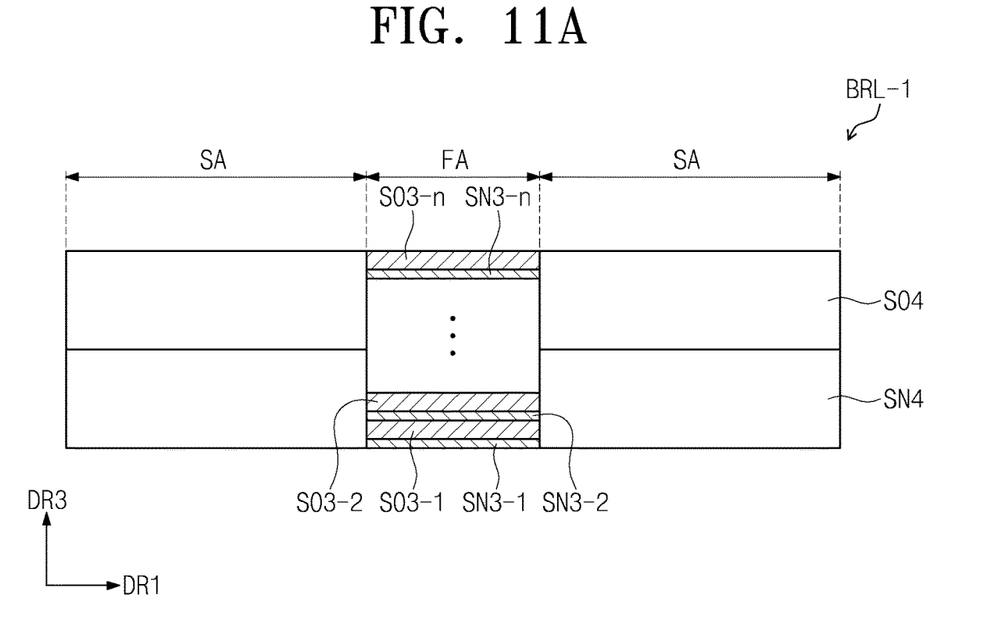
FIGS. 11A and 11B are expanded views of barrier layers according to an embodiment of the inventive concept.
Figure 11B:
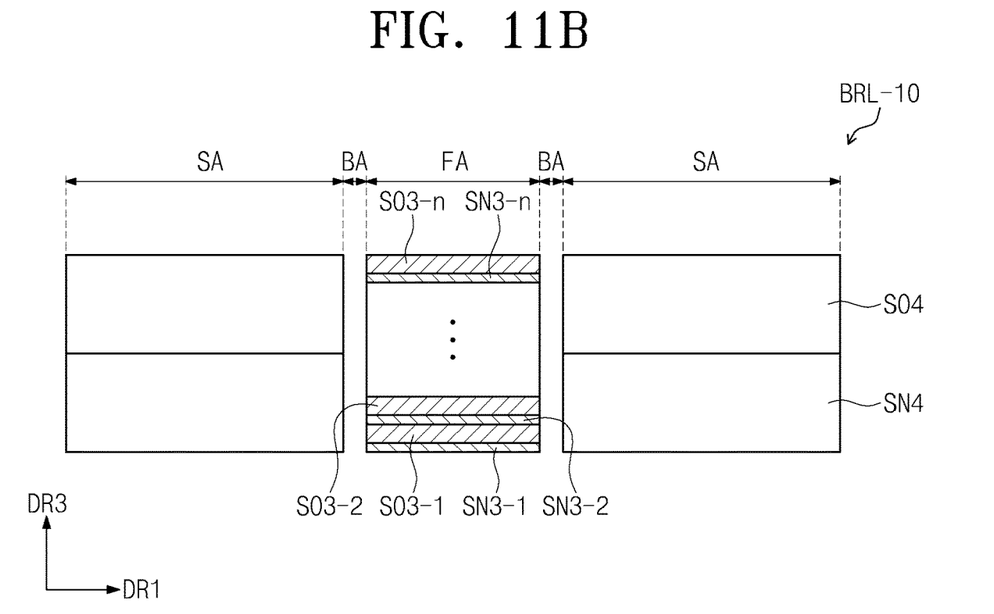

FIGS. 11A and 11B are expanded views of a barrier layer according to an embodiment of the inventive concept. Hereinafter, a barrier layer will be described in detail with reference to FIGS. 11A and 11B.

As illustrated in FIG. 11A, a barrier layer BRL-1 according to this embodiment has different layer structures by area. The barrier layer BRL-1 includes silicon nitride layers SN3-1 to SN3-$n$ (hereinafter, third silicon nitride layers) and silicon oxide layers SO3-1 to SO3-$n$ (hereinafter, third silicon oxide layers) which are overlapped with the bending area FA. The third silicon nitride layers SN3-1 to SN3-$n$ and the third silicon oxide layers SO3-1 to SO3-$n$ are stacked alternately.

Substantially, the third silicon nitride layers SN3-1 to SN3-$n$ and the third silicon oxide layers SO3-1 to SO3-$n$ may have the same configuration (layer structure and/or thickness, etc.) as the first silicon nitride layers SN1-1 to SN1-$n$ and the first silicon oxide layers SO1-1 to SO1-$n$ in FIG. 9. Therefore, even if a bending stress greater than yield strength is applied to the barrier layer BRL-1 when the flexible display panel DP is bent in the bending area FA, fracture of the barrier layer BRL-1 may be prevented.

The barrier layer BRL-1 includes at least one silicon nitride layer SN4 (hereinafter, a fourth silicon nitride layer) and at least one silicon oxide layer SO4 (hereinafter, a fourth silicon oxide layer) which are overlapped with the surrounding area SA. The fourth silicon oxide layer SO4 is overlapped with the fourth silicon nitride layer SN4. In FIG. 11A, a barrier layer BRL-1 that includes one fourth silicon oxide layer SO4 and one fourth silicon nitride layer SN4 stacked thereon was illustrated.

The fourth silicon nitride layer SN4 has a thickness greater than those of the third silicon nitride layers SN3-1 to SN3-$n$, and the fourth silicon oxide layer SO4 has a thickness greater than those of the third silicon oxide layers SO3-1 to SO3-$n$. By designing the barrier layer BRL-1 differently depending on the bending area FA and the surrounding area SA, strength of the flexible display panel DP may be maintained and fracture in the bending area FA may be prevented at the same time.

The barrier layer BRL-1 may be provided by means of chemical vapor deposition, thermal deposition, sputtering, or the like. Using two types of masks, a silicon nitride layer and a silicon oxide layer may be provided in each of the surrounding area SA and the bending area FA.

As illustrated in FIG. 11B, a boundary area BA may be defined between the bending area FA and the surrounding area SA. The third silicon nitride layers SN3-1 to SN3-$n$ and the third silicon oxide layers SO3-1 to SO3-$n$ are spaced from the fourth silicon oxide layer SO4 and the fourth silicon nitride layer SN4 with the boundary layer BA disposed therebetween. When viewed from the top, the barrier layer BRL-10 appears to include a slit defined in the boundary area BA. Although not illustrated in FIG. 11B, a substance which constitutes a layer (for example, a first insulation layer 12 (refer to FIGS. 7 and 8)) stacked on the barrier layer BRL-10 may be filled into the slit. The silt cuts off bending stress occurred in the barrier layer BRL-10 along the first direction DR1.

Figure 12A:
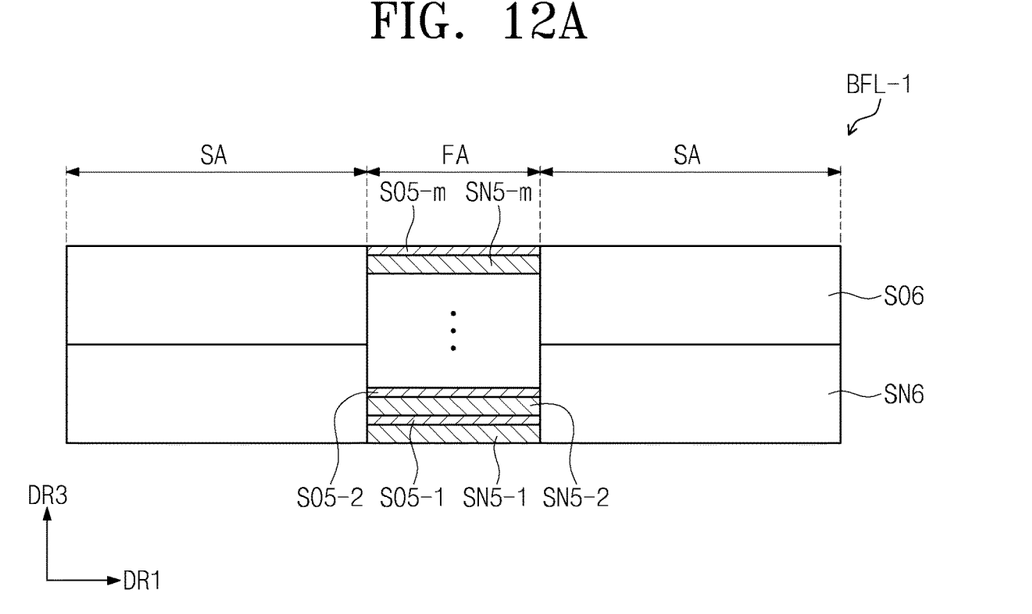
FIGS. 12A and 12B are expanded views of buffer layers according to an embodiment of the inventive concept.
Figure 12B:
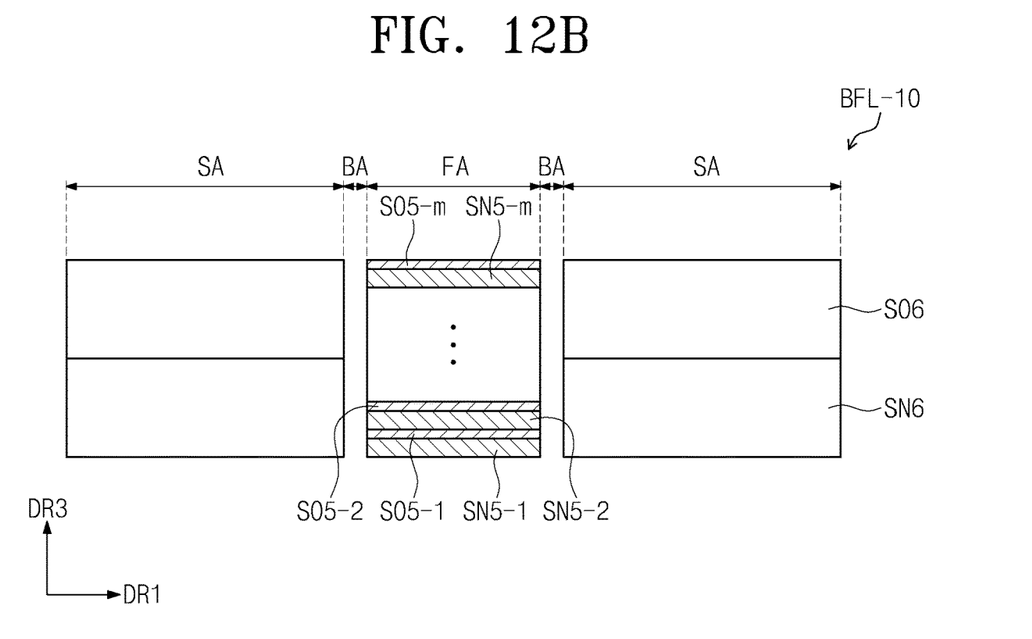

FIGS. 12A and 12B are expanded views of a buffer layer according to an embodiment of the inventive concept. Hereinafter, a buffer layer will be described in detail with reference to FIGS. 12A and 12B.

As illustrated in FIG. 12A, a buffer layer BFL-1 according to this embodiment has different layer structures by area. The buffer layer BFL-1 includes silicon nitride layers SN5-1 to SN5-$m$ (hereinafter, fifth silicon nitride layers) and silicon oxide layers SO5-1 to SO5-$m$ (hereinafter, fifth silicon oxide layers) which are overlapped with the bending area FA. Substantially, the fifth silicon nitride layers SN5-1 to SN5-$m$ and the fifth silicon oxide layers SO5-1 to SO5-$m$ may have the same configuration (layer structure and/or thickness, etc.) as the second silicon nitride layers SN2-1 to SN2-$m$ and the second silicon oxide layers SO2-1 to SO2-$m$ in FIG. 10. Therefore, even though bending stress greater than yield strength is applied to the buffer layer BFL-1 when the flexible display panel DP is bent in the bending area FA, fracture of the buffer layer BFL-1 may be prevented.

The buffer layer BFL-1 includes at least one silicon nitride layer SN6 (hereinafter, a sixth silicon nitride layer) and at least one silicon oxide layer SO6 (hereinafter, a sixth silicon oxide layer) which are overlapped with the surrounding area SA. The sixth silicon nitride layer SN6 has a thickness greater than those of the fifth silicon nitride layers SN5-1 to SN5-$m$, and the sixth silicon oxide layer SO6 has a thickness greater than those of the fifth silicon oxide layers SO5-1 to SO5-$m$.

The buffer layer BFL-1 may be provided by means of chemical vapor deposition, thermal deposition, sputtering, or the like. Using two types of masks, a silicon nitride layer and a silicon oxide layer may be stacked in the surrounding area SA and the bending area FA with different structures.

As illustrated in FIG. 12B, a boundary area BA may be defined between the bending area FA and the surrounding area SA. The fifth silicon nitride layers SN5-1 to SN5-*m* and the fifth silicon oxide layers SO5-1 to SO5-*m* are spaced from the sixth silicon oxide layer SO6 and the sixth silicon nitride layer SN6 with the boundary layer BA disposed therebetween. When viewed from the top, the buffer layer BFL-10 appears to include a slit defined in the boundary area BA. Although not illustrated in FIG. 12B, a substance which constitutes a layer (for example, a first insulation layer 12 (refer to FIGS. 7 and 8)) stacked on the buffer layer BFL-10 may be filled into the slit.

Figure 13:
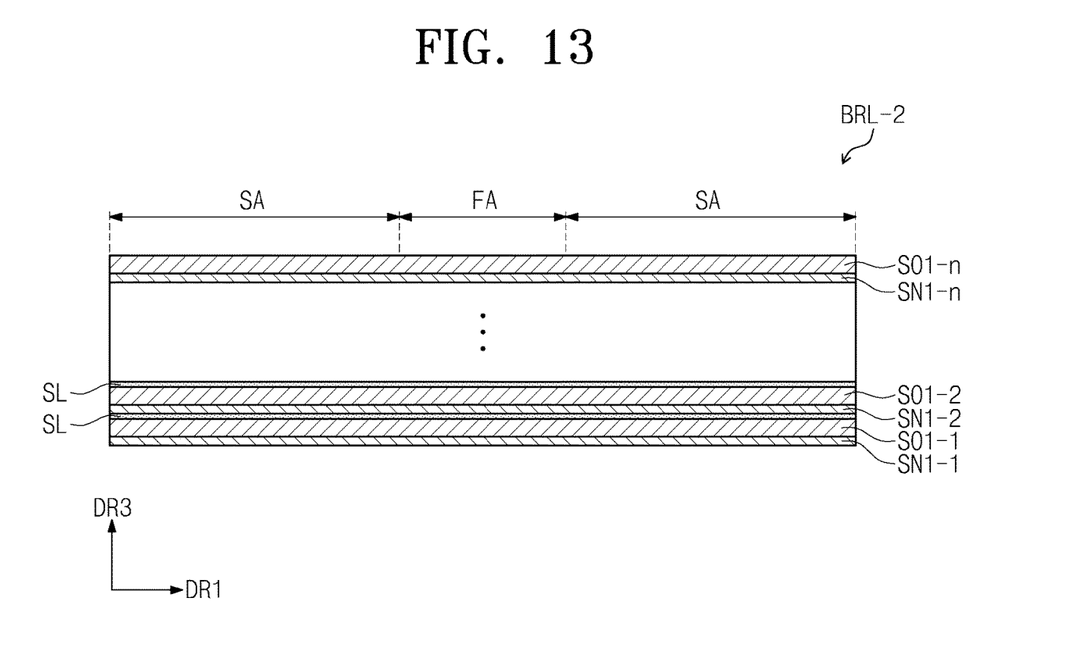
FIG. 13 is an expanded view of a barrier layer according to an embodiment of the inventive concept.

FIG. 13 is an expanded view of a barrier layer according to an embodiment of the inventive concept. Hereinafter, a barrier layer will be described in detail with reference to FIG. 13.

A barrier layer BRL-2 according to this embodiment includes at least one hardness strengthening layer SL. The hardness strengthening layer SL includes at least any one of graphene, graphene oxide, or carbon nanotube. The hardness strengthening layer SL compensate for reduced hardness of a barrier layer having a multi-layer structure as compared with a single layer structure. The hardness strengthening layer SL prevents defects (generally called stamp defects) caused by a large force applied to a local area.

FIG. 13 exemplarily illustrates the barrier layer BRL-2, which further includes the hardness strengthening layers SL disposed between silicon nitride layers and silicon oxide layers adjacent to each other, as compared with a barrier layer BRL in FIG. 9. The number of the hardness strengthening layers SL may be changed.

In one embodiment, the hardness strengthening layer SL may be disposed in the bending area FA of the barrier layers BRL-1 and BRL-10 in FIGS. 11A and 11B. The hardness strengthening layer SL may compensate for reduced hardness of the bending area FA as compared with the surrounding area SA.

In one embodiment, the buffer layers BFL, BFL-1, and BFL-10 in FIGS. 10, 12A, and 12B may also further include the hardness strengthening layer SL.

Particularly, the buffer layers BFL-1 and BFL-10 in FIGS. 12A and 12B may further include the hardness strengthening layer SL disposed in the bending area FA.

Accordingly, the barrier layer protects the pixel from impurities introduced from the outside or come out from a base member. Furthermore, the barrier layer blocks moisture from being introduced into the pixel from outsides. The buffer layer enhances properties of the thin film transistor as compared with the barrier layer.

The barrier layer and the buffer layer include silicon nitride layers and silicon oxide layers which are disposed alternately. Thereby, the bending stiffness of each of the barrier layer and the buffer layer is reduced.

Since the silicon nitride layers each has a thickness less than or equal to 400 Å, and the silicon oxide layers each has a thickness less than or equal to 650 Å, the silicon nitride layers and the silicon oxide layers have plasticity in a certain range of bending stress (tensile stress or compressive stress) greater than yield strength. Therefore, fracture of the barrier layer and the buffer layer may be prevented even though bending stress greater than yield strength is applied thereto.

By designing the layer structures of the barrier layer and the buffer layer differently depending on the bending area and the surrounding area, strength of the flexible display panel may be maintained and defects in the bending area may be prevented at the same time.

Layer structures of the barrier layers BRL, BRL-1, BRL-10, and BRL-2 and the buffer layers BFL, BFL-1, and BFL-10 may also be applied to the first insulation layer 12 (see FIGS. 7 and 8) or the second insulation layer 14 see FIGS. 7 and 8).

Above, although the invention concept was described with reference to exemplary embodiments thereof, those skilled in the art or those of ordinary skill in the art will understand that the present invention may be amended or modified without departing from the spirit and scope of the invention as defined by accompanying claims.

Therefore, technical scope of the inventive concept should not be limited to detailed descriptions in this specification, but determined by the claims.

What is claimed is:

1. A flexible display panel comprising:
   a base member including a bending area and a peripheral area adjacent to the bending area;
   a barrier layer on the base member; and
   a pixel on the barrier layer and including a thin film transistor and a display element connected to the thin film transistor,
   wherein the barrier layer includes at least one first silicon nitride layer overlapped with the bending area, at least one first silicon oxide layer overlapped with the bending area, at least one second silicon nitride layer overlapped with the peripheral area, and at least one second silicon oxide layer overlapped with the at least one second silicon nitride layer, and
   wherein a total thickness of the at least one second silicon nitride layer is greater than a total thickness of the at least one first silicon nitride layer.

2. The flexible display panel of claim 1, wherein a second silicon nitride layer of the at least one second silicon nitride layer has a thickness greater than the total thickness of the at least one first silicon nitride layer.

3. The flexible display panel of claim 2, wherein the total thickness of the at least one first silicon nitride layer is less than a total thickness of the at least one first silicon oxide layer.

4. The flexible display panel of claim 1, wherein a total thickness of the at least one second silicon oxide layer is less than a total thickness of the at least one first silicon oxide layer.

5. The flexible display panel of claim 4, wherein a second silicon oxide layer of the at least one second silicon oxide layer has a thickness less than the total thickness of the at least one first silicon oxide layer.

6. The flexible display panel of claim 1, wherein the peripheral area and the bending area of the barrier layer have substantially an equal thickness.

7. The flexible display panel of claim 1, further comprising a buffer layer on the barrier layer and contacting the thin film transistor.

8. The flexible display panel of claim 7, wherein the buffer layer includes at least one third silicon nitride layer overlapped with the bending area, at least one third silicon oxide layer overlapped with the bending area, at least one fourth silicon nitride layer overlapped with the peripheral area, and at least one fourth silicon oxide layer overlapped with the at least one fourth silicon nitride layer, and
   wherein a fourth silicon nitride layer of the at least one fourth silicon nitride layer has a thickness greater than a thickness of a third silicon nitride layer of the at least one third silicon nitride layer, and wherein a fourth silicon oxide of the at least one fourth silicon oxide layer layer has a thickness greater than a thickness of a third silicon oxide layer of the at least one third silicon oxide layer.

9. The flexible display panel of claim 8, wherein the peripheral area and the bending area of the buffer layer have substantially an equal thickness.

10. The flexible display panel of claim 9, wherein a total thickness of the at least one third silicon nitride layer is greater than a total thickness of the at least one third silicon oxide layer.

11. The flexible display panel of claim 7, wherein at least one of the barrier layer and the buffer layer includes a hardness strengthening layer overlapped with the bending area.

12. The flexible display panel of claim 1, further comprising a boundary area which is defined between the bending area and the peripheral area,
wherein the at least one first silicon nitride layer and the at least one first silicon oxide layer are spaced from the at least one second silicon nitride layer and the at least one second silicon oxide layer, respectively, with the boundary area located therebetween.

13. The flexible display panel of claim 1, wherein a first silicon nitride layer of the at least one first silicon nitride layer has a thickness less than or equal to about 400 Å, and wherein a first silicon oxide layer of the at least one first silicon oxide layer has a thickness less than or equal to about 650 Å.

14. A flexible display panel comprising:
a base member including a bending area and a peripheral area adjacent to the bending area;
a barrier layer on the base member; and
a pixel on the barrier layer and including a thin film transistor and a display element connected to the thin film transistor,
wherein the barrier layer includes at least one silicon nitride layer and at least one silicon oxide layer overlapped with the at least one silicon nitride layer,
wherein a total thickness of the at least one silicon nitride layer in the peripheral area is greater than a total thickness of the at least one silicon nitride layer in the bending area.

15. The flexible display panel of claim 14, wherein a thickness of a silicon nitride layer of the at least one silicon nitride layer is less than a thickness of a silicon oxide layer of the at least one silicon oxide layer.

* * * * *